US008185800B2

(12) United States Patent
Coteus et al.

(10) Patent No.: US 8,185,800 B2
(45) Date of Patent: May 22, 2012

(54) SYSTEM FOR ERROR CONTROL CODING FOR MEMORIES OF DIFFERENT TYPES AND ASSOCIATED METHODS

(75) Inventors: Paul W. Coteus, Yorktown Heights, NY (US); Luis A. Lastras-Montano, Cortlandt Manor, NY (US); Warren Edward Maule, Cedar Park, TX (US); Barry M. Trager, Yorktown Heights, NY (US); Shmuel Winograd, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 1148 days.

(21) Appl. No.: 12/023,408

(22) Filed: Jan. 31, 2008

(65) Prior Publication Data

US 2010/0293436 A1 Nov. 18, 2010

(51) Int. Cl.
G11C 29/00 (2006.01)
(52) U.S. Cl. .......................... 714/763; 714/784; 714/785
(58) Field of Classification Search .................. 714/763, 714/784, 785
See application file for complete search history.

(56) References Cited

U.S. PATENT DOCUMENTS

| | | | |
|---|---|---|---|
| 3,665,396 A | 5/1972 | Forney, Jr. | 714/789 |
| 4,742,519 A | 5/1988 | Abe et al. | 714/755 |
| 5,457,701 A | 10/1995 | Wasilewski et al. | 714/776 |
| 5,870,406 A | 2/1999 | Ramesh et al. | 714/709 |
| 6,018,817 A | 1/2000 | Chen et al. | 714/762 |
| 6,044,483 A | 3/2000 | Chen et al. | 714/762 |
| 6,345,375 B1 | 2/2002 | Kelkar et al. | 714/748 |
| 6,487,680 B1 | 11/2002 | Skazinski et al. | 714/23 |
| 6,539,513 B1 | 3/2003 | Chen | 714/788 |
| 6,732,289 B1 | 5/2004 | Talagala et al. | 714/6 |
| 6,851,086 B2 | 2/2005 | Szymanski | 714/781 |
| 6,996,766 B2 * | 2/2006 | Cypher | 714/764 |
| 7,017,099 B2 | 3/2006 | Micheloni et al. | 714/752 |
| 7,047,478 B2 | 5/2006 | Gregori et al. | 714/773 |
| 7,096,407 B2 * | 8/2006 | Olarig | 714/768 |
| 7,100,096 B2 | 8/2006 | Webb, Jr. et al. | 714/52 |
| 7,117,421 B1 | 10/2006 | Danilak | 714/763 |
| 7,188,296 B1 * | 3/2007 | Cypher | 714/755 |
| 7,203,890 B1 * | 4/2007 | Normoyle | 714/768 |
| 7,287,138 B2 * | 10/2007 | Bland et al. | 711/162 |

(Continued)

FOREIGN PATENT DOCUMENTS

JP 100911394 4/1998

(Continued)

OTHER PUBLICATIONS

IEEE (Signal Processing Systems Design and Implementation, SIPS '06), Wei Liu et al., "Low-Power High-Throughput BCH Error Correction VLSI Design for Multi-Level Cell NAND Flash Memories", pp. 303-308, Oct. 2006.

(Continued)

Primary Examiner — Esaw Abraham
(74) Attorney, Agent, or Firm — Ido Tuchman

(57) ABSTRACT

A system to improve error control coding. An example system includes memory chips of at least two different kinds. The system also includes error control encoder circuitry to substantially encode data for storage in any memory rank. The system further includes error control decoder circuitry to substantially decode encoded data received from any memory rank. The error decoder circuitry is comprised of a slow decoder and a fast decoder.

21 Claims, 12 Drawing Sheets

U.S. PATENT DOCUMENTS

| | | | |
|---|---|---|---|
| 7,409,581 B2 * | 8/2008 | Santeler et al. | 714/6.1 |
| 7,493,534 B2 * | 2/2009 | Pomaranski et al. | 714/723 |
| 7,496,826 B2 * | 2/2009 | Holman | 714/785 |
| 7,509,560 B2 * | 3/2009 | Alexander et al. | 714/763 |
| 7,530,008 B2 * | 5/2009 | Das et al. | 714/784 |
| 7,774,651 B2 * | 8/2010 | Mukherjee et al. | 714/26 |
| 2003/0110330 A1 | 6/2003 | Fujie et al. | 710/36 |
| 2003/0135782 A1 | 7/2003 | Matsunami et al. | 714/5 |
| 2004/0153844 A1 | 8/2004 | Ghose et al. | 714/42 |
| 2004/0250196 A1 | 12/2004 | Hassner et al. | 714/788 |
| 2006/0029065 A1 | 2/2006 | Fellman | 370/389 |
| 2006/0104279 A1 | 5/2006 | Fellman et al. | 370/392 |
| 2006/0117211 A1 | 6/2006 | Matsunami et al. | 714/4 |
| 2006/0233199 A1 | 10/2006 | Harriman | 370/469 |

FOREIGN PATENT DOCUMENTS

WO    WO2005062478 A1    7/2005

OTHER PUBLICATIONS

IBM, Bond et al., "Error Correction and Detection Circuit for Multiple Memory Types", pp. 376-377, Technical Disclosure Bulletin Apr. 1988 v30 n11.

IBM, Aichelmann, "Paging from Multiple Bit Array Without Distributed Buffering", pp. 485-488, Technical Disclosure Bulletin, Jun. 1981 v24 n1B.

* cited by examiner

US 8,185,800 B2

SYSTEM FOR ERROR CONTROL CODING FOR MEMORIES OF DIFFERENT TYPES AND ASSOCIATED METHODS

GOVERNMENT LICENSE RIGHTS

This invention was made with Government support under Agreement No. HR0011-07-9-0002 awarded by DARPA. The Government has certain rights in the invention.

RELATED APPLICATIONS

This application contains subject matter related to the following co-pending applications entitled "System for Error Decoding with Retries and Associated Methods" and having a Ser. No. 12/023,356, "System to Improve Memory Reliability and Associated Methods" and having a Ser. No. 12/023,374, "System to Improve Error Code Decoding Using Historical Information and Associated Methods" and having a Ser. No. 12,023,445, "System to Improve Memory Failure Management and Associated Methods" and having a Ser. No. 12/023,498, "System to Improve Miscorrection Rates in Error Control Code Through Buffering and Associated Methods" and having a Ser. No. 12/023,516, and "System to Improve Error Correction Using Variable Latency and Associated Methods" and having a Ser. No. 12/023,546, the entire subject matters of which are incorporated herein by reference in their entirety. The aforementioned applications are assigned to the same assignee as this application, International Business Machines Corporation of Armonk, N.Y.

FIELD OF THE INVENTION

The invention relates to the field of computer systems, and, more particularly, to error control coding and related methods.

BACKGROUND OF THE INVENTION

This invention relates generally to computer memory, and more particularly to providing a high fault tolerant memory system.

Computer systems often require a considerable amount of high speed RAM (random access memory) to hold information such as operating system software, programs and other data while a computer is powered on and operational. This information is normally binary, composed of patterns of 1's and 0's known as bits of data. The bits of data are often grouped and organized at a higher level. A byte, for example, is typically composed of 8 bits; more generally these groups are called symbols and may consist on any number of bits.

Computer RAM is often designed with pluggable subsystems, often in the form of modules, so that incremental amounts of RAM can be added to each computer, dictated by the specific memory requirements for each system and application. The acronym, "DIMM" refers to dual in-line memory modules, which are perhaps the most prevalent memory module currently in use. A DIMM is a thin rectangular card comprising one or more memory devices, and may also include one or more of registers, buffers, hub devices, and/or non-volatile storage (e.g., erasable programmable read only memory or "EPROM") as well as various passive devices (e.g. resistors and capacitors), all mounted to the card.

DIMMs are often designed with dynamic memory chips or DRAMs that need to be regularly refreshed to prevent the data stored within them from being lost. Originally, DRAM chips were asynchronous devices, however contemporary chips, synchronous DRAM (SDRAM) (e.g. single data rate or "SDR", double data rate or "DDR", DDR2, DDR3, etc) have synchronous interfaces to improve performance. DDR devices are available that use pre-fetching along with other speed enhancements to improve memory bandwidth and to reduce latency. DDR3, for example, has a standard burst length of 8, where the term burst length refers to the number of DRAM transfers in which information is conveyed from or to the DRAM during a read or write. Another important parameter of DRAM devices is the number of I/O pins that it has to convey read/write data. When a DRAM device has 4 pins, it is said that it is a "by 4" (or ×4) device. When it has 8 pins, it is said that it is a "by 8" (or ×8) device, and so on.

Memory device densities have continued to grow as computer systems have become more powerful. Currently it is not uncommon to have the RAM content of a single computer be composed of hundreds of trillions of bits. Unfortunately, the failure of just a portion of a single RAM device can cause the entire computer system to fail. When memory errors occur, which may be "hard" (repeating) or "soft" (one-time or intermittent) failures, these failures may occur as single cell, multi-bit, full chip or full DIMM failures and all or part of the system RAM may be unusable until it is repaired. Repair turn-around-times can be hours or even days, which can have a substantial impact to a business dependent on the computer systems.

The probability of encountering a RAM failure during normal operations has continued to increase as the amount of memory storage in contemporary computers continues to grow.

Techniques to detect and correct bit errors have evolved into an elaborate science over the past several decades. Perhaps the most basic detection technique is the generation of odd or even parity where the number of 1's or 0's in a data word are "exclusive or-ed" (XOR-ed) together to produce a parity bit. For example, a data word with an even number of 1's will have a parity bit of 0 and a data word with an odd number of 1's will have a parity bit of 1, with this parity bit data appended to the stored memory data. If there is a single error present in the data word during a read operation, it can be detected by regenerating parity from the data and then checking to see that it matches the stored (originally generated) parity.

More sophisticated codes allow for detection and correction of errors that can affect groups of bits rather than individual bits; Reed-Solomon codes are an example of a class of powerful and well understood codes that can be used for these types of applications.

These error detection and error correction techniques are commonly used to restore data to its original/correct form in noisy communication transmission media or for storage media where there is a finite probability of data errors due to the physical characteristics of the device. The memory devices generally store data as voltage levels representing a 1 or a 0 in RAM and are subject to both device failure and state changes due to high energy cosmic rays and alpha particles.

In the 1980's, RAM memory device sizes first reached the point where they became sensitive to alpha particle hits and cosmic rays causing memory bits to flip. These particles do not damage the device but can create memory errors. These are known as soft errors, and most often affect just a single bit. Once identified, the bit failure can be corrected by simply rewriting the memory location. The frequency of soft errors has grown to the point that it has a noticeable impact on overall system reliability.

Memory Error Correction Codes (ECC) use a combination of parity checks in various bit positions of the data word to allow detection and correction of errors. Every time data words are written into memory, these parity checks need to be generated and stored with the data. Upon retrieval of the data, a decoder can use the parity bits thus generated together with the data message in order to determine whether there was an error and to proceed with error correction if feasible.

The first ECCs were applied to RAM in computer systems in an effort to increase fault-tolerance beyond that allowed by previous means. Binary ECC codes were deployed that allowed for double-bit error detection (DED) and single-bit error correction (SEC). This SEC/DED ECC also allows for transparent recovery of single bit hard errors in RAM.

Scrubbing routines were also developed to help reduce memory errors by locating soft errors through a scanning of the memory whereby memory was read, corrected if necessary and then written back to memory.

Some storage manufacturers have used advanced ECC techniques, such as Reed-Solomon codes, to correct for full memory chip failures. Some memory system designs also have standard reserve memory chips (e.g. "spare" chips) that can be automatically introduced in a memory system to replace a faulty chip. These advancements have greatly improved RAM reliability, but as memory size continues to grow and customers' reliability expectations increase, further enhancements are needed.

FIG. 1 depicts a contemporary prior art system composed of an integrated processor chip 100, which contains one or more processor elements and an integrated memory controller 110. In the configuration depicted in FIG. 1, multiple independent cascade interconnected memory interface busses 106 are logically aggregated together to operate in unison to support a single independent access request at a higher bandwidth with data and error detection/correction information distributed or "striped" across the parallel busses and associated devices.

The memory controller 110 attaches to four narrow/high speed point-to-point memory busses 106, with each bus 106 connecting one of the several unique memory controller interface channels to a cascade interconnect memory subsystem 103 (or memory module, e.g., a DIMM) which includes at least a hub device 104 and one or more memory devices 109. Some systems further enable operations when a subset of the memory busses 106 are populated with memory subsystems 103. In this case, the one or more populated memory busses 108 may operate in unison to support a single access request.

FIG. 2 depicts a prior art memory structure with cascaded memory modules 103 and unidirectional busses 106. One of the functions provided by the hub devices 104 in the memory modules 103 in the cascade structure is a re-drive function to send signals on the unidirectional busses 106 to other memory modules 103 or to the memory controller 110.

FIG. 2 includes the memory controller 110 and four memory modules 103, on each of two memory busses 106 (a downstream memory bus with 24 wires and an upstream memory bus with 25 wires), connected to the memory controller 110 in either a direct or cascaded manner. The memory module 103 next to the memory controller 110 is connected to the memory controller 110 in a direct manner. The other memory modules 103 are connected to the memory controller 110 in a cascaded manner. Although not shown in this figure, the memory controller 110 may be integrated in the processor 100 and may connect to more than one memory bus 106 as depicted in FIG. 1.

The connection between a hub in a DIMM and a memory controller may have transmission errors and therefore such a connection may be protected using error detection codes. In these types of designs, the memory controller checks a detection code during a read and if there is a mismatch, it issues a retry request for the faulty read (and possibly other read requests that happened in the near time vicinity). To support such retry mechanisms, the memory controller maintains a queue of pending requests which is used to determine which requests.

The evolution of the minimal burst length parameter of DRAM devices has been such that it makes it increasingly more difficult to provide for desirable error correction properties such as multiple chipkill support. The trend for such minimal burst length has to increase as new DRAM technologies are introduced.

As an illustrative example, assume that a processor has a cache line of 128B, and that ancillary information totaling 4 additional bytes needs to be stored and protected together with the cache line. Such ancillary information will vary from processor design to processor design. Again for illustrative purposes, suppose the additional information is comprised of a flag indicating whether the data was corrupted even before reaching memory (the SUE flag), tag bits that can be used in data structures and a node bit that indicates whether a more recent copy of the cache line may exist elsewhere in the system.

In the DDR3 generation of DRAM devices, the minimal burst length on each device is equal to 8 transfers. Therefore a ×4 DRAM device (which by definition has 4 I/O pins) delivers/accepts a minimum of 32 bits (4 bytes) on each read/write access. Correspondingly, a ×8 DRAM device delivers/accepts a minimum of 64 bits (8 bytes) on each read/write access. Assuming a processor cache line of size 128 bytes, and assuming that for every 8 data chips there is an additional $9^{th}$ chip that provides additional storage for error correction/detection codes, a simple calculation demonstrates that a total of 36×4 devices can be accessed in parallel to supply a total of 144 bytes (out of which 128 bytes are for data, and 4 bytes are for ancillary information). Similarly, a total of 18×8 devices can be accessed in parallel to supply a total of 144 bytes.

As we stated earlier, it is highly desirable for an error correction code to provide for the ability to survive a chipkill. Unfortunately, those skilled in the art will recognize that while it is possible to allow for chipkill recovery in the setting where 2 of the 18 chips are completely devoted to redundant checks, once the additional ancillary information is introduced as a storage requirement it becomes mathematically impossible to allow for the recovery of chipkills with 100% certainty.

One alternative is to construct a memory using ×4 parts instead, since in this memory geometry a total of 32 devices may be devoted to data, the $33^{rd}$ device may be devoted to the ancillary information which would leave 3 additional chips for redundant information. Such redundancy will allow, as those skilled in the art will recognize, to have single chip error correct/double chip error detect capabilities for the system.

A strong reason for not using ×4 parts nonetheless is related to power consumption. Assume that ×4 and ×8 parts have identical storage capacity. Contrasting two systems with exactly the same number of chips, but one with ×4 chips and the other one with ×8 chips, the same amount of "standby" power is incurred in both (standby power is the amount of power paid in the absence of any memory activity).

Nonetheless, every time an access is made to memory, in the ×4 memory configuration a total of 36 devices are activated simultaneously, as opposed to the ×8 situation where only 18 devices are activated simultaneously. Therefore, the "active" power (paid during memory accesses) is double in the ×4 setting than in the ×8 setting.

SUMMARY OF THE INVENTION

In view of the foregoing background, it is an object of the invention to provide a system that improves error control coding for memories of different types.

This and other objects, features, and advantages in accordance with the invention are provided by a system to improve error control coding. The system may include memory chips of at least two different kinds organized into types of memory ranks based upon the at least two kinds and number of memory chips. The system may also include error control encoder circuitry to substantially encode data for storage in any memory rank. The system may further include error control decoder circuitry to substantially decode encoded data received from any memory rank. The error control decoder circuitry may have both a fast decoding mode and a slow decoding mode.

The type of the memory may be passed as a parameter to the error control decoder circuitry. The same error control encoder circuitry may be used independently of the at least two kinds of memory chips present in the memory rank receiving the encoded data.

The at least two kinds of each memory chip may be determined by an input pin count and an output pin count for each of the memory chips. The memory chips may have an input pin count and an output pin count of 4, 8, or 16.

The error control encoder circuitry's error handling capabilities may differ as the type of the memory differs. The slow decoder in the decoder may be sensitive to the type of the memory. The error control encoder circuitry may use a parity check matrix based upon a Reed-Solomon code. The error control decoder circuitry may support different numbers of memory chip failures for memory ranks of different types.

Another aspect of the invention is a method for error control coding for memories of different types. The method may include organizing memory chips of at least two different kinds into types of memory ranks based upon the at least two kinds and number of memory chips. The method may also include using error control encoder circuitry to substantially encode data for storage in any of the memory ranks. The method may further include using error control decoder circuitry to substantially decode encoded data received from any memory rank. The error control decoder circuitry may have both a fast decoding mode and a slow decoding mode.

DETAILED DESCRIPTION OF THE PREFERRED EMBODIMENTS

Figure 1:
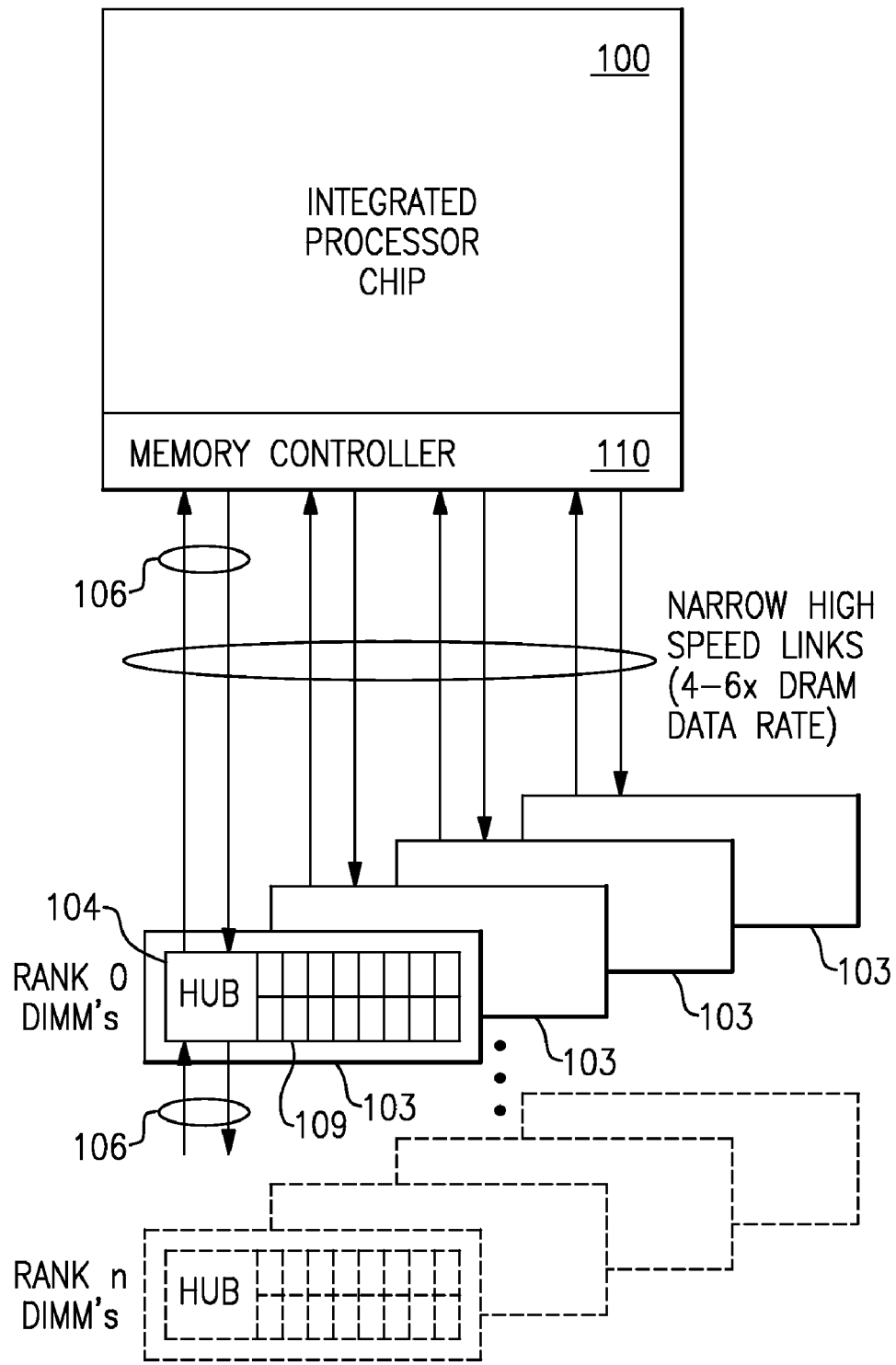
FIG. 1 is a schematic block diagram that describes a prior art integrated processor chip with a memory controller that is able to store and retrieve data from several memory ranks.

The invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

As will be appreciated by one skilled in the art, the invention may be embodied as a method, system, or computer program product. Furthermore, the invention may take the form of a computer program product on a computer-usable storage medium having computer-usable program code embodied in the medium.

Any suitable computer usable or computer readable medium may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, or a magnetic storage device.

Computer program code for carrying out operations of the invention may be written in an object oriented programming language such as Java, Smalltalk, C++ or the like. However, the computer program code for carrying out operations of the invention may also be written in conventional procedural programming languages, such as the "C" programming language or similar programming languages.

The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

Figure 3:
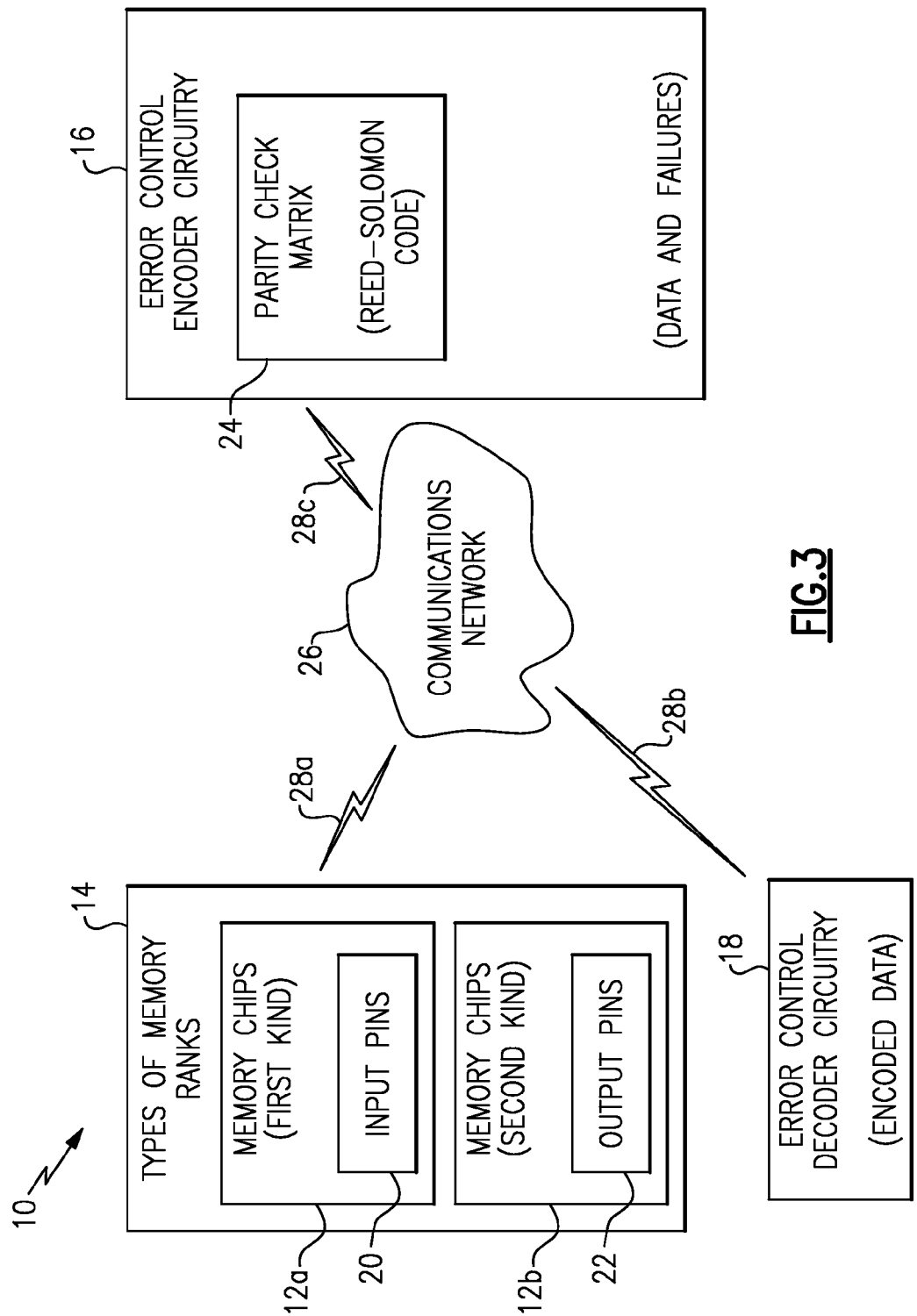
FIG. 3 is a schematic block diagram of a system to improve error correction in accordance with the invention.

Referring to FIG. 3, a system 10 to improve error control coding for memories of different types is initially described. The system 10 includes memory chips 12a and 12b of at least two different kinds organized into types of memory ranks 14 based upon the at least two kinds and the number of memory chips in a given configuration, for example. The system 10 also includes error control encoder circuitry 16 to substantially encode data for storage in any memory rank 14, for instance. The system 10 further includes error control decoder circuitry 18 to substantially decode the encoded data received from any of the memory ranks 14, for example.

In one embodiment, the kinds of memory chips 12a and 12b in any memory rank 14 is passed to the error control decoder circuitry 18. The same error control encoder circuitry 16 is used independently of the kinds of memory chips 12a and 12b present in the memory rank 14 receiving the encoded data, for instance.

In one embodiment, the kinds of each memory chip 12a and 12b is determined by an input pin 20 count and an output pin 22 count for each of the memory chips. For example, the memory chips 12a and 12b may have an input pin 20 count and/or an output pin 22 count of 4, 8, 16, or the like.

In one embodiment, the error control encoder circuitry's 16 reliability for memory ranks 14 with different kinds of memory chips 12a and 12b may differ from the error control decoder circuitry's 18 reliability for memory ranks with different kinds of memory chips. The error control encoder circuitry 16 use a parity check matrix 24 based upon a Reed-Solomon code, for instance. In another embodiment, the error control decoder circuitry 18 support different numbers of memory chip 12a and 12b failures for memory ranks 14 of different types.

The system 10 also includes a communications network 26, for instance. In one embodiment, the communications network 26 is a wired and/or wireless network including private and public communications infrastructure as will be appreciated by those of skill in the art. In one embodiment, the memory ranks 14, the memory chips 12a and 12b, the error control decoder circuitry 18, and the error control encoder circuitry 16, communicate with each other over the communications network 26 using communications links 28a-28c, respectively, as will be appreciated by those of skill in the art.

In order to provide a wide range of adaptability to different workloads and system design specifications, it may be desirable for a processor to be able to operate with different memory configurations. For example, variations in configurations may be obtained by using different chip types when building the memory, changing the number of chips that are accessed in parallel on any given access, or both.

At the same time, it may be preferable that support for multiple memory configurations does not result in a significant increase in the amount of resources (chip area, firmware support, etc.) required. One important element for supporting memory accesses is the error control coding mechanisms that are standard in mid to high end computing servers.

In view of the foregoing, the system 10 that allows a computing system to perform error control coding for various memory configurations, where the error control coding circuitry is largely shared among the different memory configurations. Such flexible error control coding allows for a favorable tradeoff between the number and types of failures one may correct and memory bandwidth/power, without any significant expense incurred for allowing for the flexibility.

Figure 2:
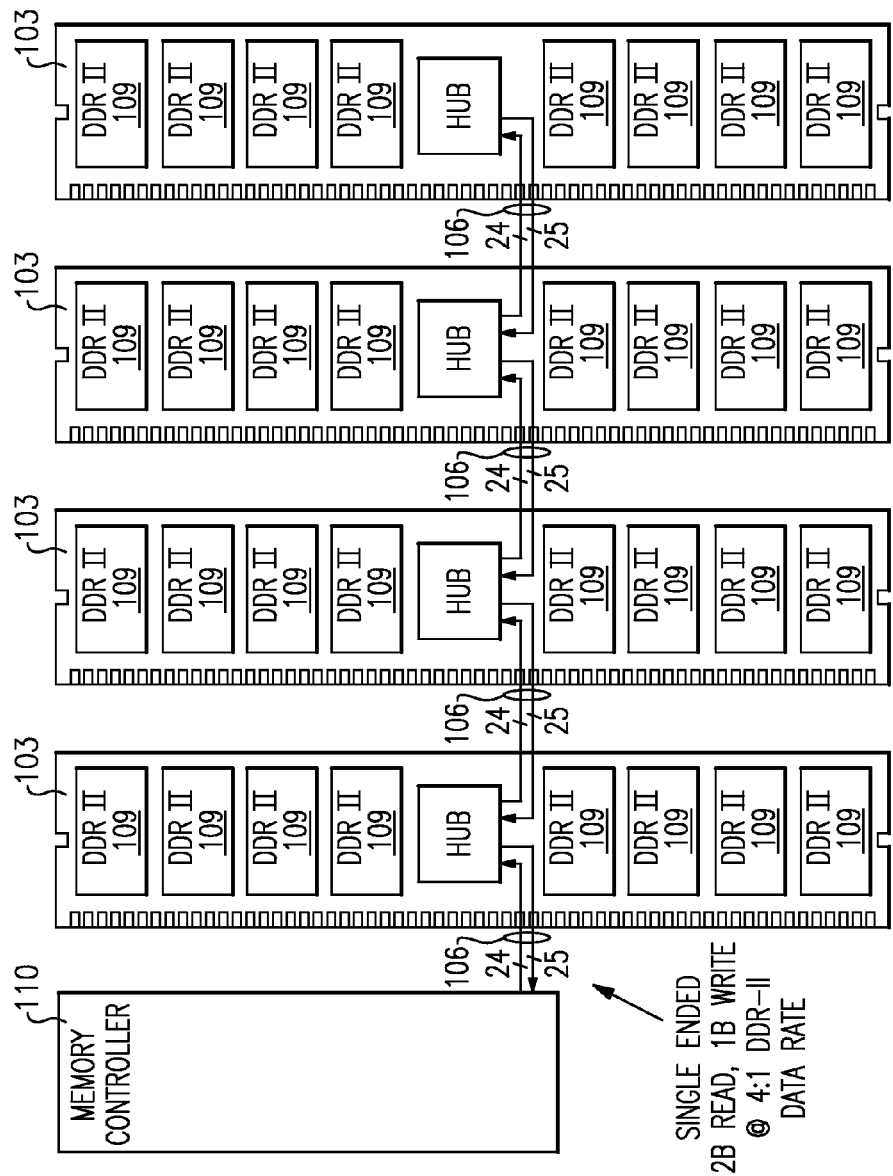
FIG. 2 illustrates how prior art memory DIMMs may be chained together and connected to a memory controller.

Another aspect of the invention is directed to a method for error control coding for memories of different types, which is now described with reference to flowchart 40 of FIG. 2. The method begins at Block 42 and may include using error control encoder circuitry to substantially encode data for storage in memories of different types at Block 44. The method may also include using error control decoder circuitry to substantially decode encoded data received from memories of different types; wherein the error control circuitry has a fast decoding mode and a slow decoding mode at Block 46. The method ends at Block 48.

A prophetic example of how the system 10 may work is now described with additional reference to FIGS. 5-13.

Figure 5:
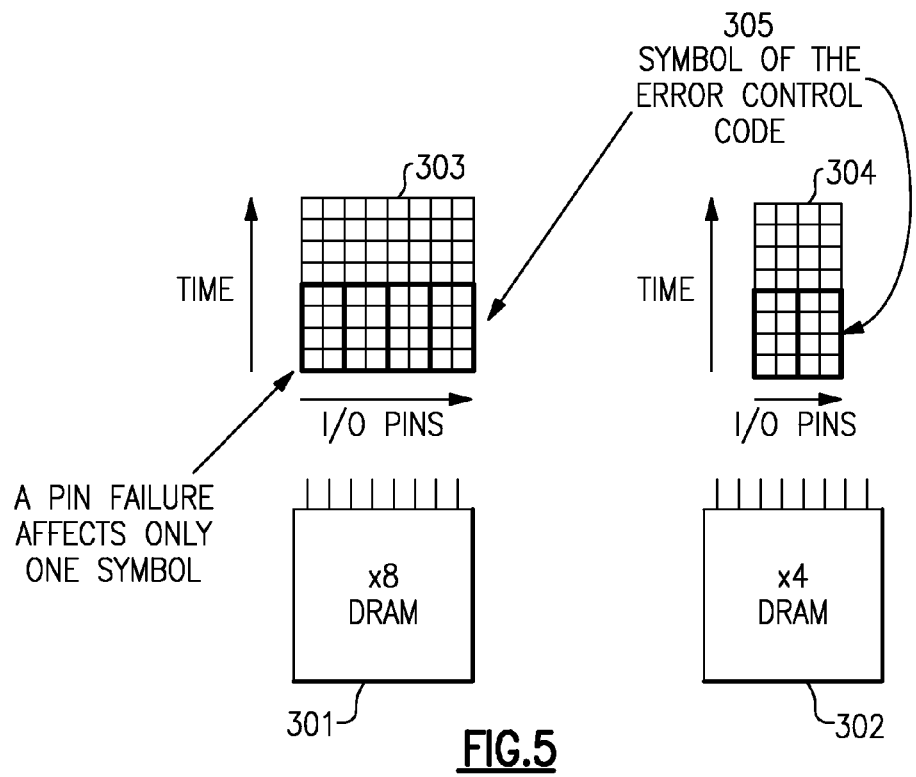
FIG. 5 describes ×4 and ×8 DRAM chips and also illustrates a possibility for mapping the bits in an error control code symbol to the output bits of a DRAM in accordance with the invention.

In FIG. 5 we describe a ×8 DRAM 301, which has 8 input/output pins and a ×4 DRAM 302 which has 4 input/output pins. Both kinds of DRAMs, when accessed for a write or read operation accept or deliver information through a minimum of 8 transfers, which are illustrated in the transmission patterns 303, 304. In these transmission patterns, each box represents a bit. Thus a total of 64 bits (8 bytes) are delivered by a ×8 DRAM during read and a total of 32 bits (4 bytes) are delivered by a ×4 DRAM during a read.

Error control codes generally operate on symbols which are comprised on one or more bits. For the purposes of this exemplary embodiment, symbols will contain 8 bits. Also illustrated in FIG. 5 is a possible assignment 305 of the bits to a symbol of the error control code. Thus in this assignment a symbol of the error control code spans two consecutive pins of a DRAM and 4 consecutive transfers.

Figure 4:
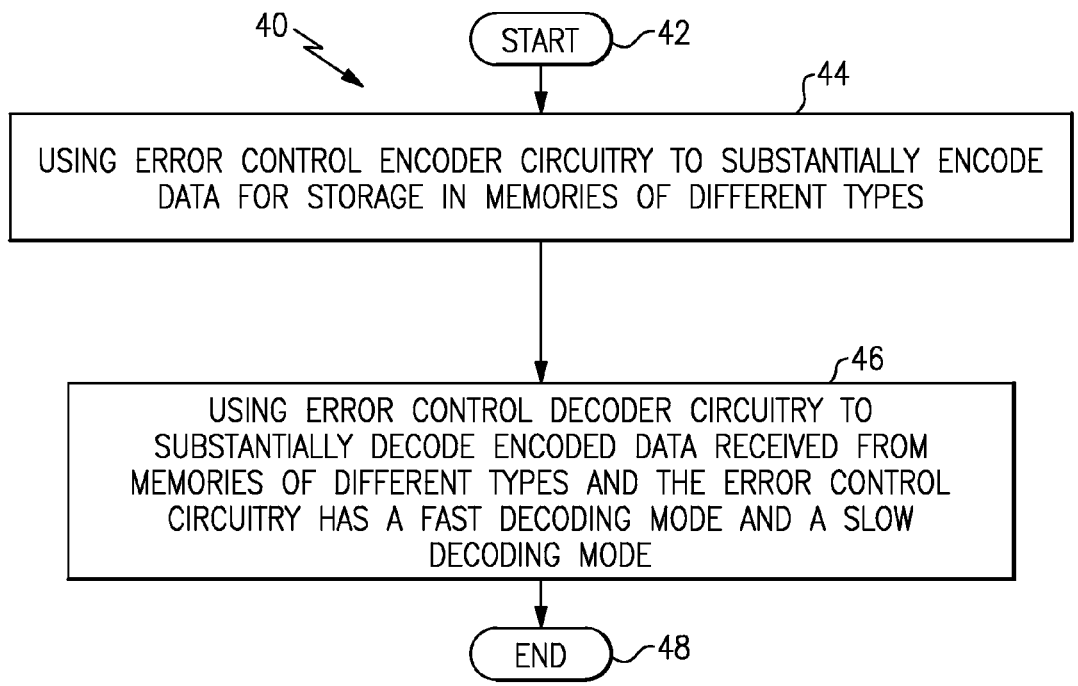
FIG. 4 is a flowchart illustrating method aspects according to the invention.
Figure 6:
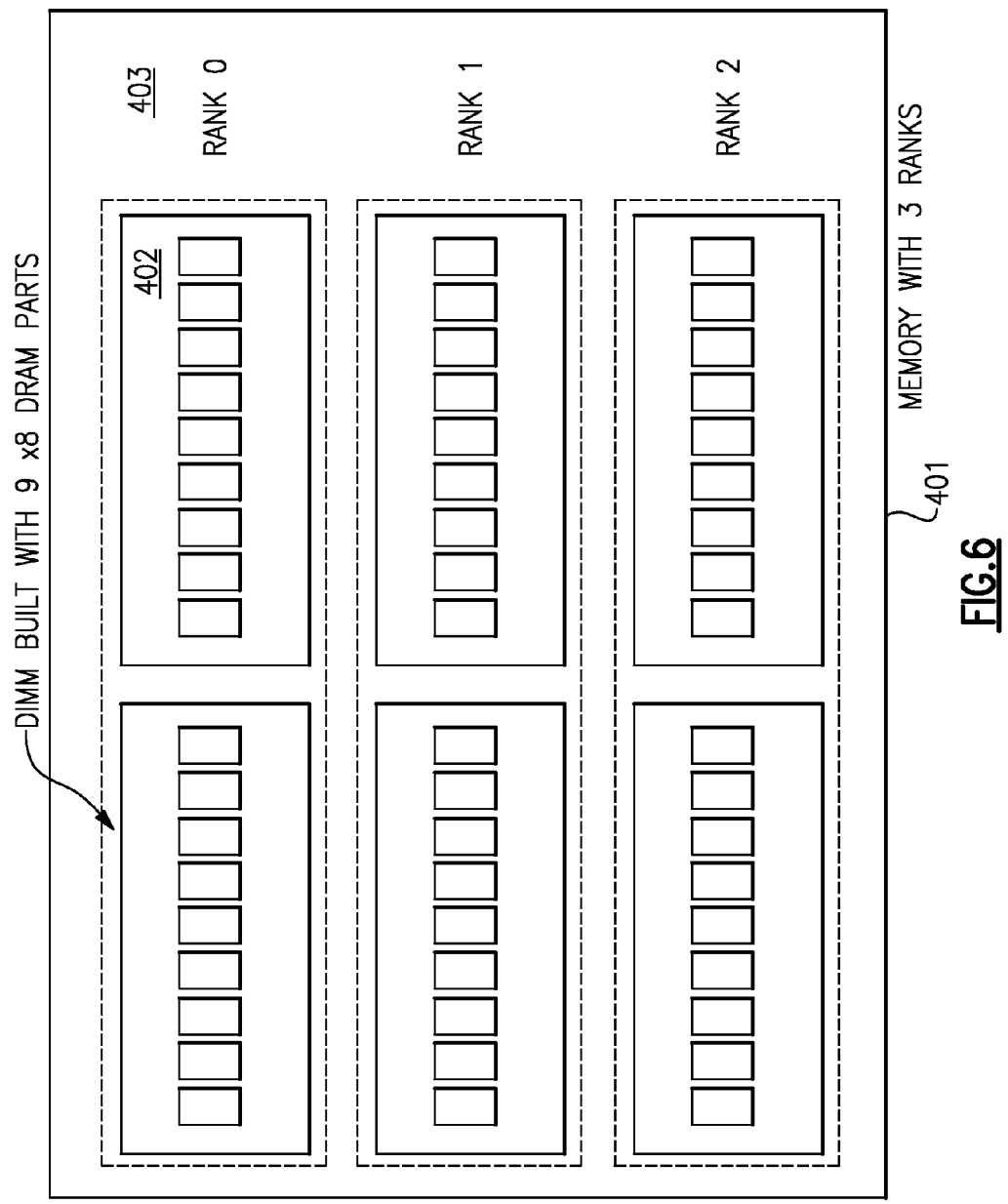
FIG. 6. illustrates a memory system with 3 ranks pairs of DIMMs operate in parallel to provide for storage of cache lines in a processor, where the DIMMs are constructed using ×8 DRAM parts in accordance with the invention.
Figure 7:
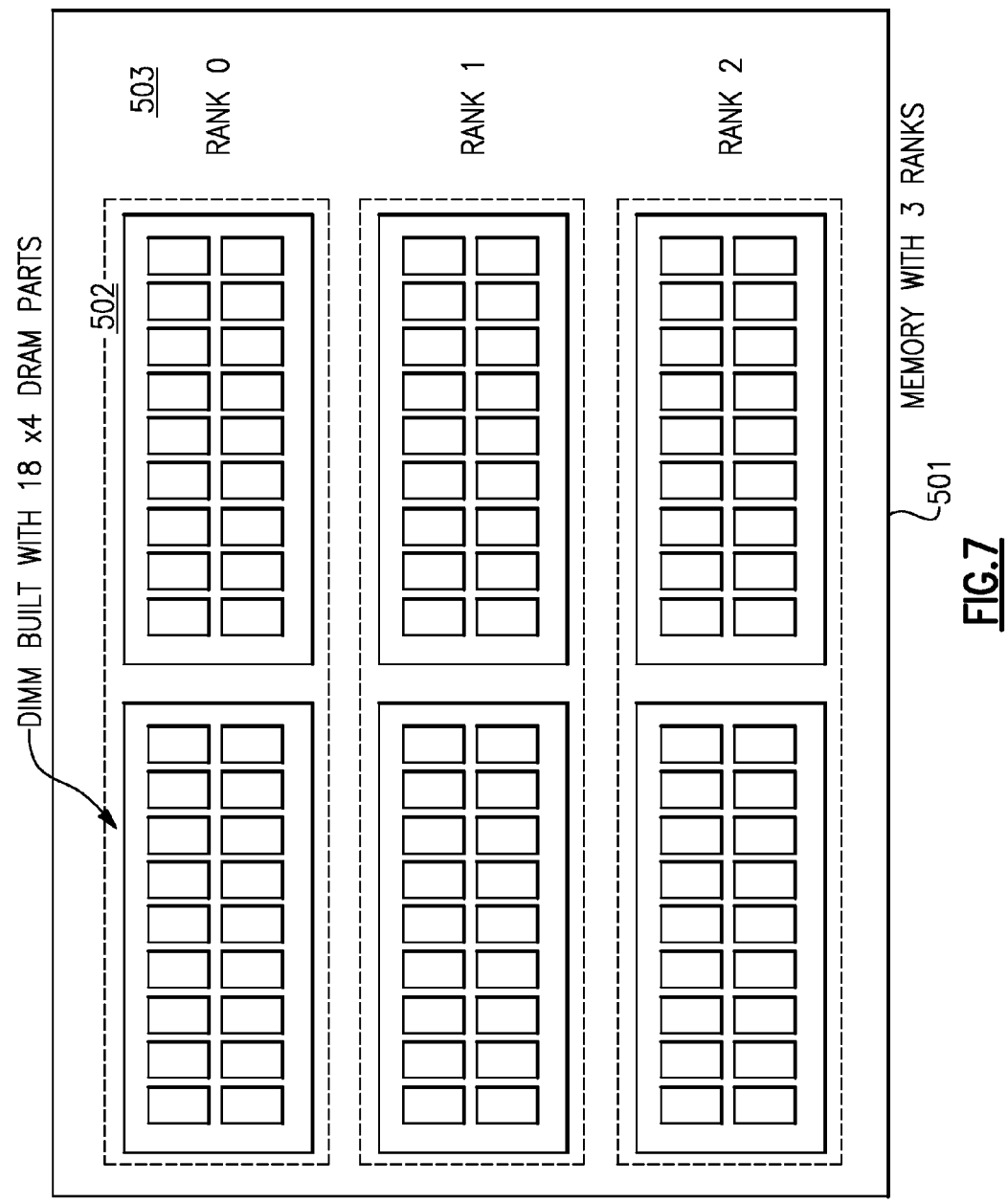
FIG. 7. illustrates a memory system with 3 ranks pairs of DIMMs operate in parallel to provide for storage of cache lines in a processor, where the DIMMs are constructed using ×4 DRAM parts in accordance with the invention.

In FIG. 6 we illustrate a memory system 401 that is constructed from DIMMs 402 in which each DIMM is built using 9×8 DRAMs. A memory rank 403 is formed by two DIMMs operating in parallel. The memory system in FIG. 4. has three ranks. In general DIMMs can have more than one rank. FIG. 7 illustrates a memory system in which DIMMs are built using 18×4 parts each. Thus the number of pins in a DRAM chip determines the type of the chip and in turn this determines the type of the memory rank and the memory system.

Figure 8:
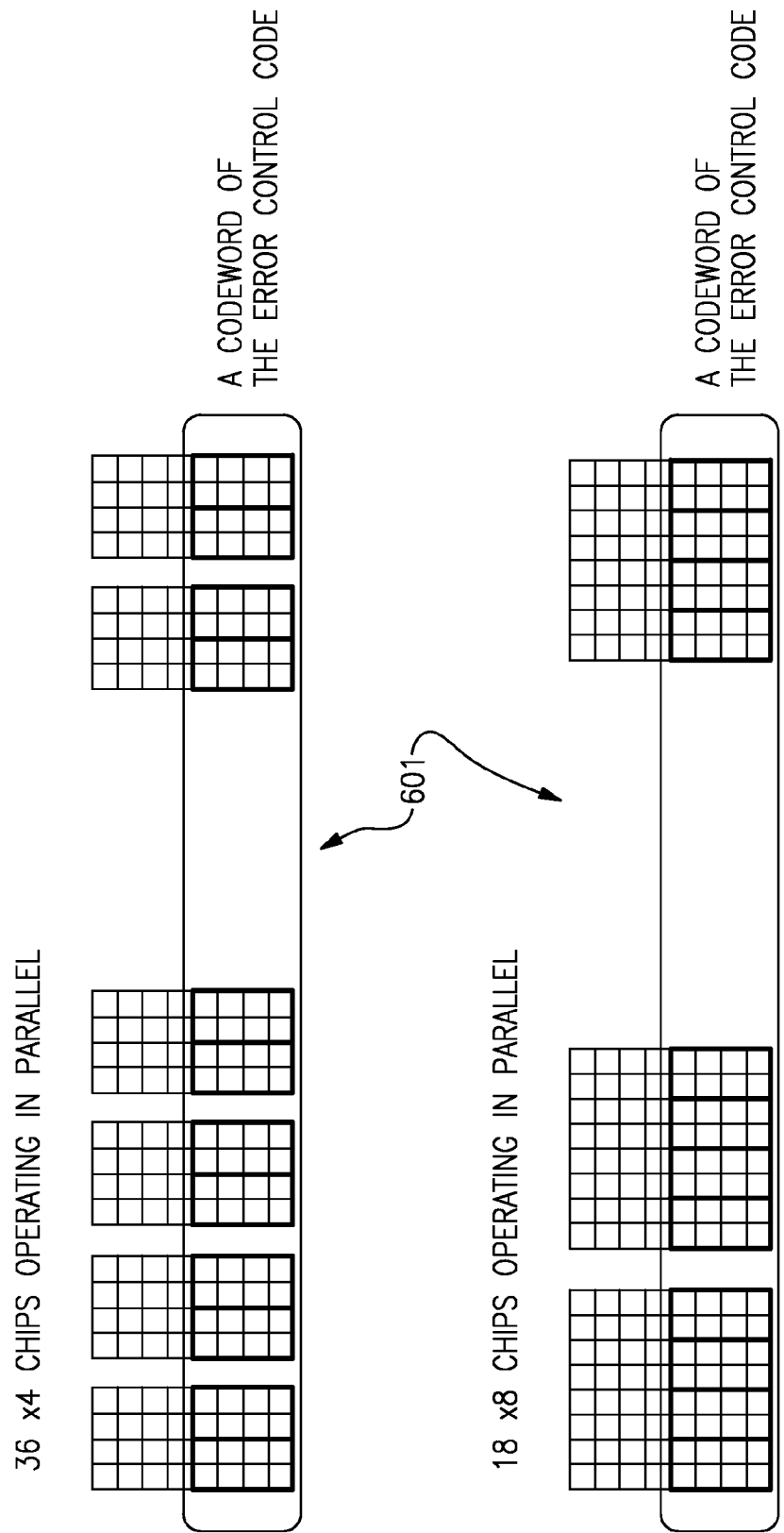
FIG. 8 illustrates how an error control code codeword is mapped to the output of 36×4 chips operating in parallel and also to the output of 18×8 chips operating in parallel in accordance with the invention.

FIG. 8 illustrates how an error control codeword 601 is obtained from the output of 36×4 DRAM chips operating in parallel or 18×8 DRAM chips operating in parallel. Such a codeword in both cases is obtained through four consecutive transfers of the DRAM and in both cases is a total of 72B. Two consecutive codewords are thus received when DRAMs of either type are accessed during a read. An error control codeword will equivalently be called a packet throughout the description of this invention.

For the purposes of this exemplary embodiment we shall assume that the error control code that is employed in this invention is a Reed-Solomon code whose symbols are comprised of 8 bits. In the 72 byte codeword, 64 byes will be dedicated to data, one byte will be dedicated to hold ancillary information and the additional 7 bytes will contain checks coming from a Reed-Solomon code. Thus the Reed-Solomon code, in the parlance of coding theory, as parameters [n=72, k=65]. During the course of this invention we shall take advantage of the fact that error control codes (including Reed-Solomon codes) can accept information about the location of failures in order to improve their error correction and detection capacity.

Figure 9:
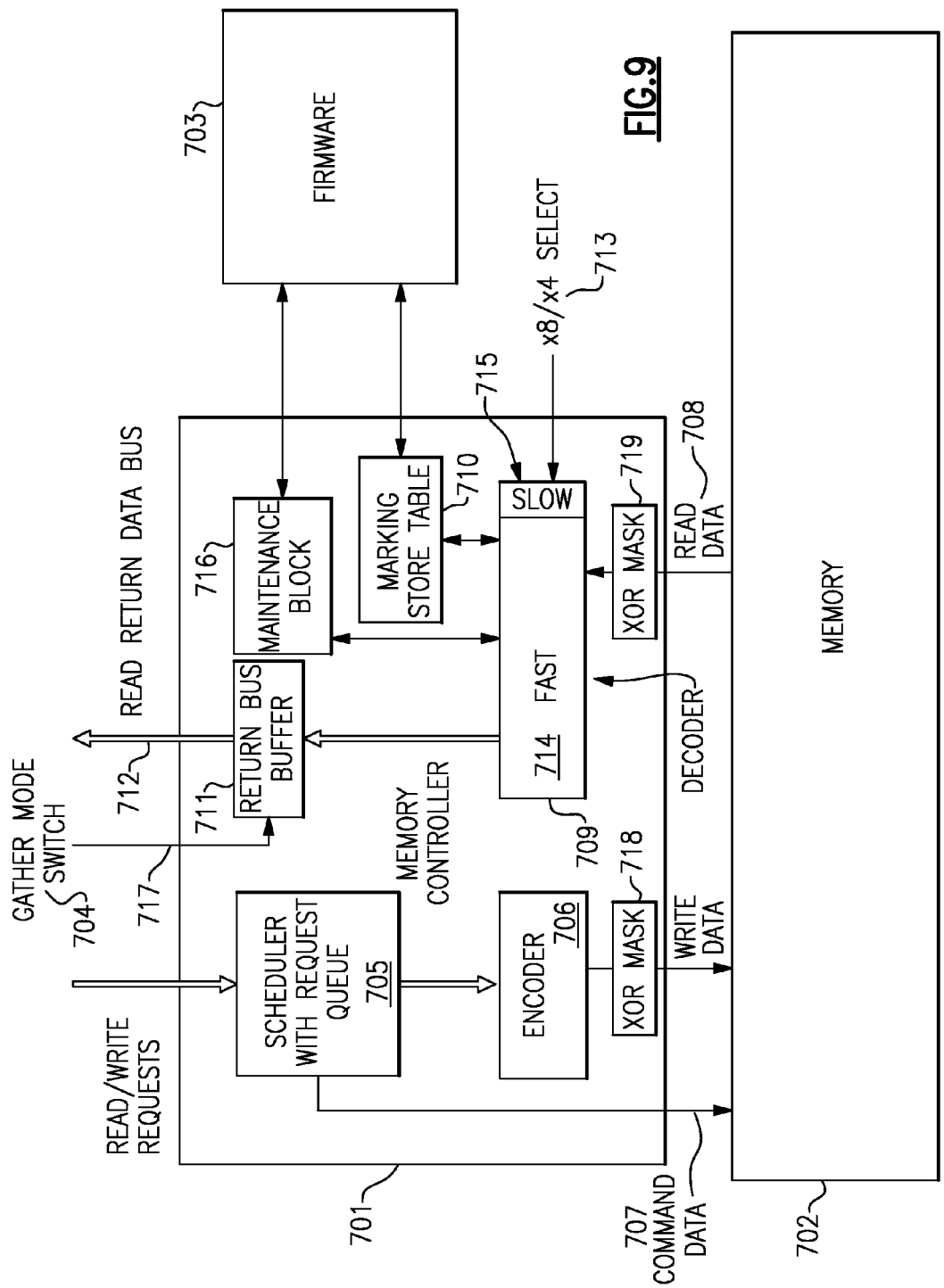
FIG. 9. is a block schematic that describes relevant parts of a memory controller and how it interacts with memory and firmware in accordance with the invention.

In FIG. 9 we find a general diagram describing how a memory controller 701 interacts with a memory 702 and firmware 703. The memory controller accepts read/write requests 704 and schedules them in a request queue 705. Write requests are passed to the encoder 706 which computes check bits for the given data packet and then sends the result to the memory 702 for storage. Prior to such storage taking place, this invention has the possibility of applying an XOR mask 718 to the data that might depend on the address of the write request. This XOR mask has a counterpart in the read process 719.

The goal of this XOR mask is to ensure that if a chipkill affects two consecutive 72B data packets and if the nature of the chipkill is that the chip produces a constant data output, then the errors appear different in both packets. This brings benefits to the miscorrection rates of the decoder when it is operating in Gather mode (set by switch 717). Read requests are made to the memory by issuing the proper commands 707 to the memory 702.

The memory returns data 708 request in a read which is then fed to the error control decoder 709. The received data is processor by the error control decoder 709 either through the fast decoder 714 or the slow decoder 715. The latter happens when the data coming from the memory has an error that cannot be decoded using the fast decoder 714 alone.

The decoder 709 uses information about prior failures that might have affected the memory rank from which the data is coming from. Such prior failure information is stored in the Marking Store 710 which is read by the decoder prior to decoding any data coming from the memory 708. This Marking store 710 is simply a table which has a number of bytes for every memory rank to which the memory controller can connect to.

The information stored in the marking store 710 essentially contains the locations of the symbols in the error control codeword that are expected to have errors; the decoder 709 uses this information in the calculations leading to the decoding of the Reed-Solomon code to mathematically erase the contributions of the information received in these locations in order to determine whether there are any additional errors in unknown locations that might be correctable.

The symbol location in the marking store 710 can be encoded both as a number to be interpreted as a Galois Field element, or might describe the symbol in a DIMM rank as a numeric offset. The decoder 709, computes the locations and magnitudes of any additional errors that might be present in the codeword, as well as the error magnitudes of the errors presumed in the known locations. If there are no such errors, then the error magnitude for the latter will be equal to zero.

Upon correcting any errors in the data received from the memory 708, the decoder 709 forwards the corrected message to a return bus buffer 711 that in which data is staged for transmission across a read return data bus 712. The return bus buffer 711 also accepts a gather mode switch signal 717 which if enabled, causes two or more packets to be buffered and their uncorrectable error flags combined using a logical OR operation in order to generate single global uncorrectable error flag. The effect that this has is to significantly improve miscorrection rates in the decoder, if so judged necessary.

The decoder 709 is able to process data coming both from a memory built using ×8 DRAM parts as well as a memory built using ×4 DRAM parts. To this end, there is a signal 713 which may be employed to set an operation mode for the decoder. In the present exemplary embodiment, the ×8/×4 control signal affects only the slow decoder; this is, the fast decoder 714 is oblivious as to what kind of memory the data is being received from. This is possible because for either kind of memory, exactly the same [72,65] Reed-Solomon code (over GF(256)) is employed and because the role of the fast decoder 714 is to correct for any errors denoted by marking information stored in the Marking Store 710 and to correct an additional symbol error only, as opposed to a full new ×4 or ×8 chipkill (we refer the reader to FIG. 5. in which it will be appreciated that a ×8 chipkill affects up to 4 symbols of the error control code whereas a ×4 chipkill can affect up to 2 symbols of the error control code). The fast decoder 714 is equipped to be able to correct for up to 4 potential symbol errors in known locations (4 erasures, in the parlance of coding theory), and therefore it is able to correct a marked ×8 chipkill or two marked ×4 chipkills, and still be able to correct an additional symbol error.

Most of the circuitry in the decoder is attributed to the fast decoder 714, and as such the present design offers a design in which largely the same circuitry can be used to decode memories of two different types.

The slow decoder 715 has the responsibility of locating new chipkills and as such, it needs to know whether it is looking for ×4 chipkills or ×8 chipkills. As such, it uses the ×8/×4 select signal 713 in order to determine which mode to operate on. The operation of the slow decoder 715 requires the memory controller to retry any pending requests to memory since the slow decoder can only process on request at the time. At the end of the operation of the slow decoder, a new chipkill may have been found and if so, the Marking Store 710 is updated automatically with the information about the chipkill thus encountered. In addition, the firmware 703 is notified that a new chipkill has been encountered, so that it can note the chipkill in a logfile and start tracking further errors coming from the associated memory rank. This notification takes place through the maintenance block 716, which has the ability to communicate with the firmware 703.

Information communicated back to the firmware 703 through the maintenance block 716 is not limited to new chipkills countered. If the fast decoder has found an additional symbol error beyond those that might be found in marked locations (given by information coming from the Marking Store 710), then a notification that a New Correctable Symbol Error (NCSE) has occurred is given to the maintenance block 716 which in turn communicates it to the firmware 703.

The firmware 703 also has the ability to affect the marking store. This is allowed because the firmware 703 has considerably more resources than the hardware to keep track of failure statistics and such it might decide to remove a chipkill mark that is placed automatically by the decoder 714 in the marking store 710, since that chipkill might have been a temporary failure. In addition, the firmware 703 might decide to place a symbol mark if too many New Correctable Symbol Errors are being generated at some location in memory. The firmware 703 is also able to place chipkill marks. Since the hardware can also update the marking store table 710, a method for coordinating conflicting writes in the marking store 710 is needed. In this invention, the firmware 703 may request a change to the table 710 and then a notification that the write was successful may be obtained from the hardware.

Figure 10:
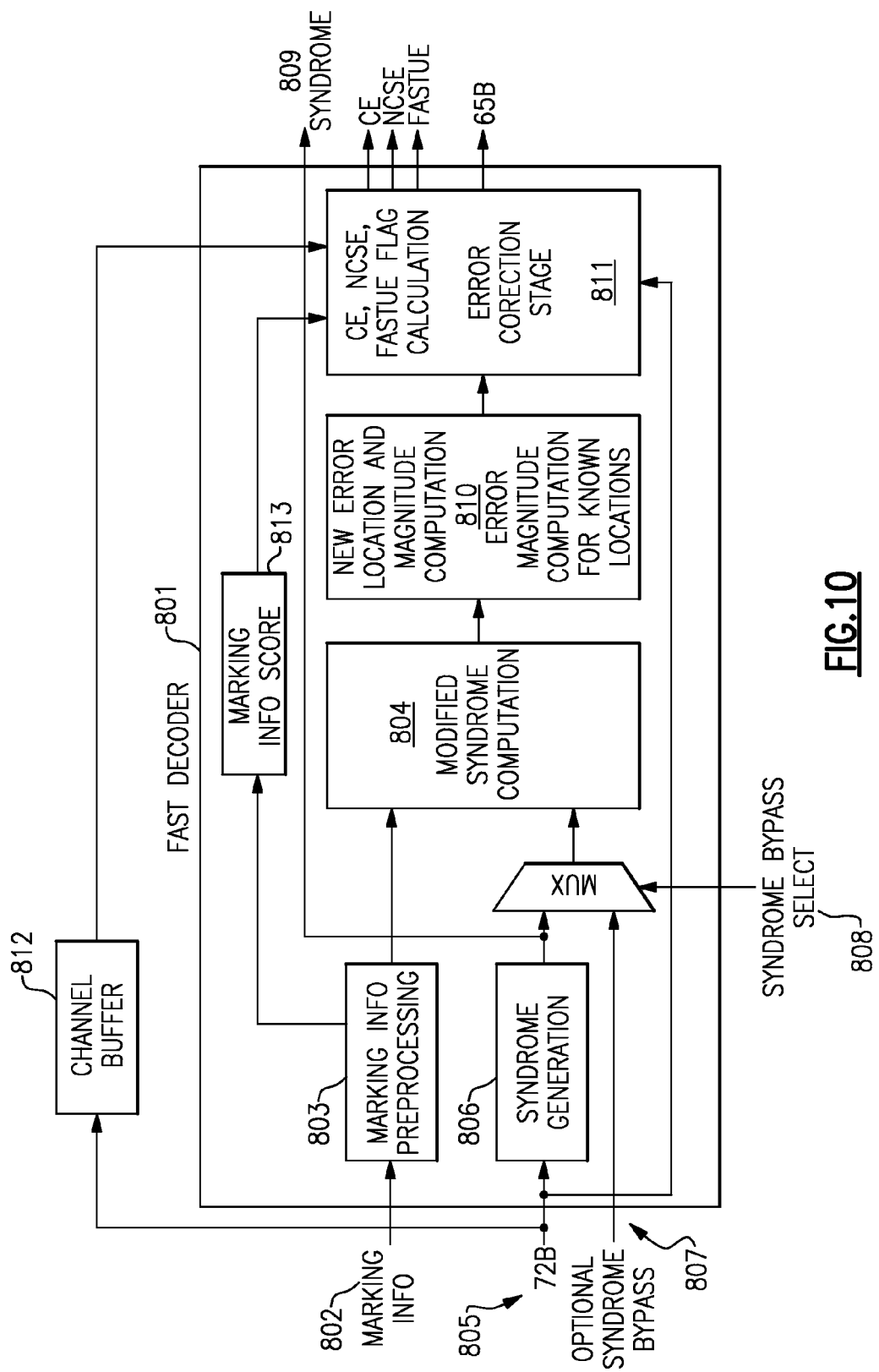
FIG. 10. describes the internal structure of the fast decoder, along with this main inputs and outputs in accordance with the invention.

In FIG. 10, we find a description of the internal organization of the fast decoder 801. Inputs to the fast decoder 801 include the marking info 802 that is retrieved from the Marking Store Table 710, which is preprocessed in preparation to the computation of the modified syndromes 804. Another input to the fast decoder is 72B of data 805 to be decoded. This data is fed to a syndrome generation stage 806 whose output is then fed to the Modified Syndrome Computation 804 engine. The latter combines the syndrome and the preprocessed marking information to produce new syndromes that describe errors that do not contain contributions from potential errors in marked locations. The modified syndromes could be equal to zero, in which case no further errors need to be corrected for, or could be nonzero, in which case a new correctable symbol error may exist.

The syndromes fed to the Modified Syndrome Computation engine 804 can come from the syndrome generation circuit 806 or may come externally through an optional syndrome bypass path 807. The fast decoder 801 has a signal 808 that allows to select which syndrome is fed to the modified syndrome computation engine 804. The bypass path is a useful in the slow decoder where the fast decoder 801 needs to be reused on the same data since but it is inconvenient to feed the original data again for syndrome generation. Then the previously computed syndrome of the original data can be fed through the bypass path 807. To this end, the syndrome of the data is an output 809 of the fast decoder.

The modified syndromes are fed to a circuit 810 that computes the error magnitudes of those errors that might exist in known locations, as well as the error magnitude and location of a potential new correctable symbol error. The result of this computation, along with several other partial computations useful for the generation of flags, are passed to an error correction stage 811 that combines the original potentially corrupted data (which has been stored temporarily in a channel buffer 812) with the error magnitudes and the (potential) new symbol error location computed in the earlier stage 810. In 811 we additionally compute several flags which summarize the analysis that the fast decoder has done of the data 805. These flags are: 1) the Correctable Error (CE) flag, which is true if any error (marked or not) was corrected and false otherwise; 2) the New Correctable Symbol Error (NCSE) which is true if and only if the fast decoder 801 found (and corrected) a symbol in error in a location not previously marked by the marking info 802; and 3) The FastUE flag, which is true if the error present in the data cannot be corrected by the fast decoder giving the current marking information 802.

It will be appreciated by the reader that the Fast decoder does not have an x4/x8 input to modify its behavior depending on the nature of the memory parts used to build a memory system.

The marking information 803 is fed to a module 813 that computes a marking information score which is then fed to the error correction and flag computation stage 811. The score is a measure of how much exposure the system has to unsupported errors and is directly related to how many symbols have been previously marked according to the marking info 802. This score may simply be related to a count of the number of symbols that have been marked or may be a more complex function of the location and number of marked symbols. We adopt the convention that a low score indicates a higher exposure than a higher score. The error correction and flag computation stage can take advantage of the score as follows. It is known that many hard failures in DRAM parts are concentrated in a single pin of the DRAM. As it may be appreciated from FIG. 1, due to the manner in which we map symbols to information bits in the DRAM, a pin failure translates into only one symbol failure and in particular, the failure of one nibble of the DRAM. If the marking info score is too low, there may be an exposure to miscorrection on catastrophic errors and as such, it may be desirable to trade off some correction capabilities for an increased protection against miscorrections. Such a suitable tradeoff can be obtained by limiting any New Correctable Symbol Errors, if the marking info score so warrants, to correct only if the error is concentrated in one of the two nibbles. This would have the effect of decreasing the miscorrection rates on catastrophic errors (modeled for example by choosing a syndrome at random as the input to the decoder) by a factor of 8. The memory rank score is a concept that may be employed in different situations. For example, the firmware 703 may compute this score from copies of the marking info that it possesses to determine whether a service request may be placed to replace a defective DIMM. Additionally, the system may move data from a rank with a low score to a rank with a higher score in order to improve the reliability of the overall system.

In normal circumstances, 72B worth of data are fed to the Fast decoder, and in the presence of no new errors (in addition to the marked locations) or in the presence of a new correctable symbol error (in addition to the marked locations), the error would be corrected and passed on for consumption by the system.

When the fast decoder declares a FastUE, it could be because the error stored in the DRAM is uncorrectable by the Fast decoder, or because such error would be correctable but the data received by the fast decoder suffered additional corruptions during the transmission from the DRAM storage to the input of the decoder. For example, there could be a transmission error in the bus 106 connecting the hub 104 in a DIMM 103 to a memory controller 110. To this end, the memory controller retries the 72B read request, along with other read requests.

Figure 11:
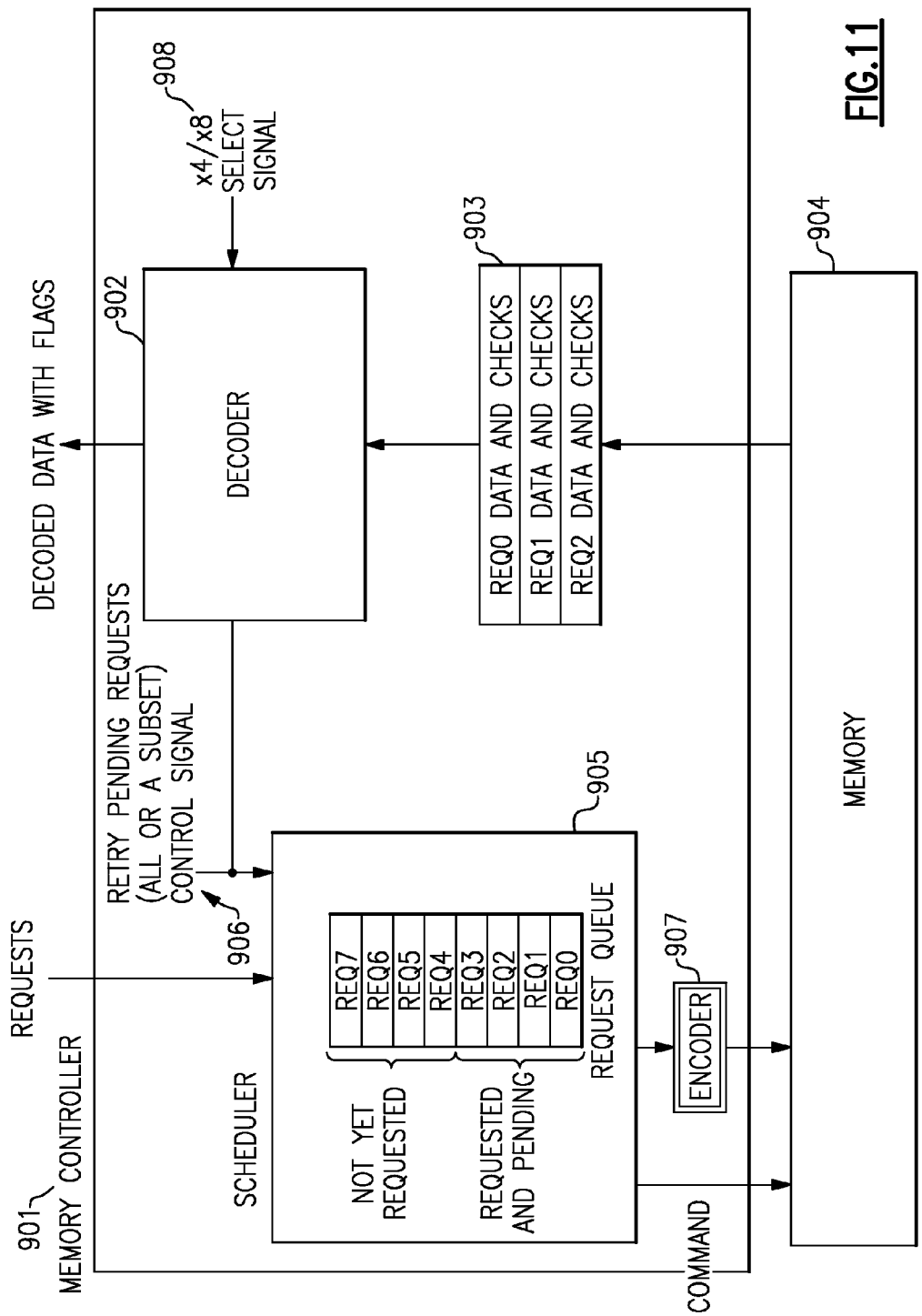
FIG. 11. describes a request queue together with a control signal that can be used to retry pending requests, which can be activated by the memory controller in accordance with the invention.

We refer the reader to FIG. 11 for the subsequent discussion. It can be seen that the memory controller 901 is equipped with a scheduler 905 that has a request queue. In this queue we will find requests that have been made and are pending (these requests could be for read or write data) and also other requests that have not yet been scheduled. The data from the most recent request 903 is fed to the decoder 902 which on a first access to this data, may declare a FastUE. If so, the decoder exercises the control signal 906 in order to request a retry of the current request, as well as all other requests behind it.

An important element of the present design is that the retry is done for two 72B packets, as opposed to only one (a retry of more than two packets is feasible as an extension of this invention). The main reason two 72B packets are requested is so that a more thorough analysis can be made of the errors that might be present in both packets. These two 72B packets are stored in exactly the same memory rank and in fact are streamed back-to-back from the DRAM devices (since the DRAM devices have a burst length of 8 and each 72B packet is communicated in exactly 4 DRAM transfers in either ×4 or ×8 mode). Therefore, a chipkill is expected to corrupt both data packets at the same chip location, of course in general with different error magnitudes. Thus an analysis of both packets at the same time would greatly increase the level of confidence that the decoder will have on its veredict of the nature of the error that occurred in both error packets.

When the two 72B packets come back to the memory controller 901 after the initial retry happened, they are fed to the decoder in a special retry mode.

Figure 12:
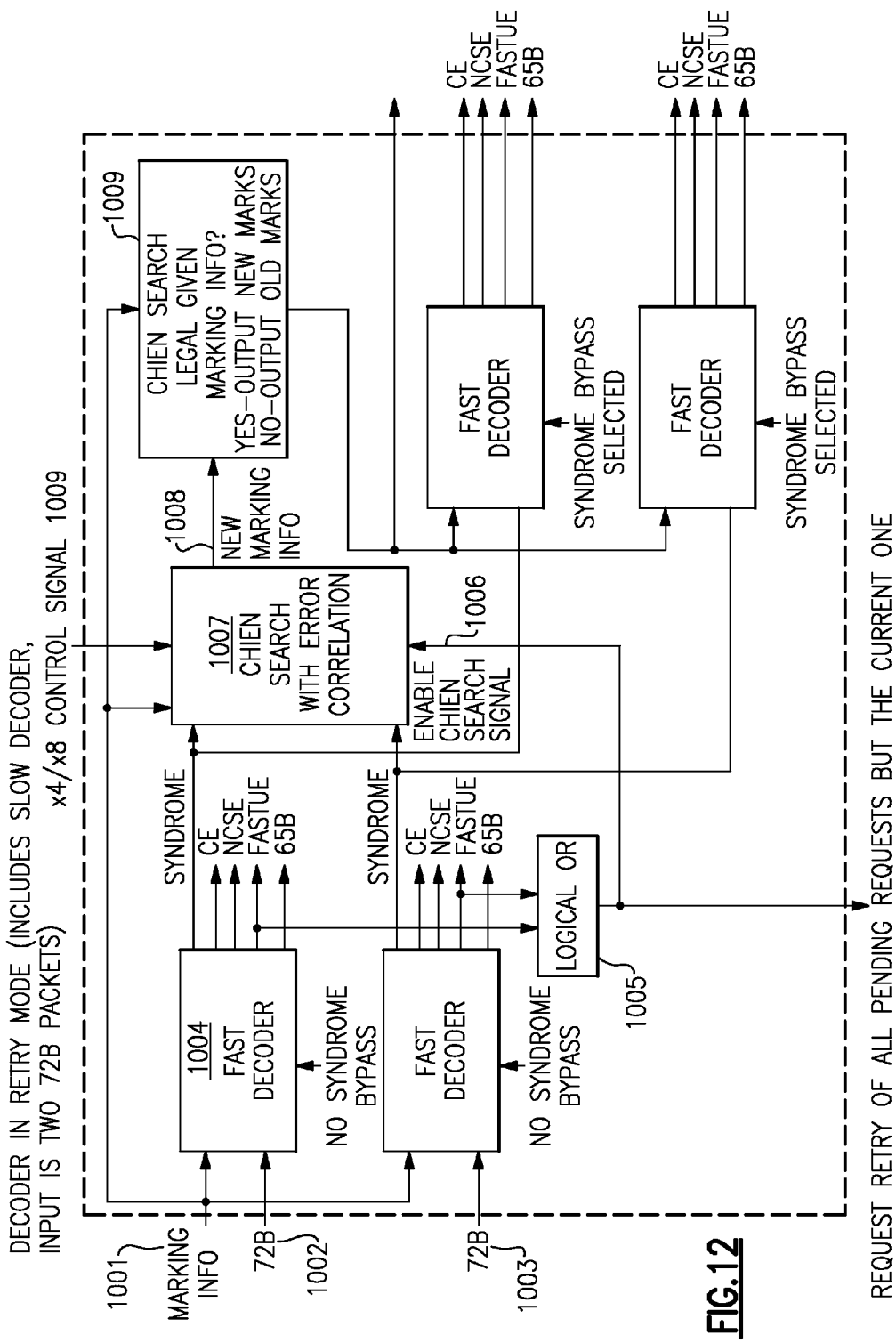
FIG. 12. illustrates how a fast decoder is combined with a Chien search to implement a decoder that may be used during a memory controller retry to resolve for errors that could not be resolved by the fast decoder alone in accordance with the invention.

A diagram of the retry mode is found in FIG. 12. The marking information for the memory rank from which the two 72B packets are coming from is fed through input 1001. A first data packet 1002 and a second data packet 1003 are fed to the Fast decoder. It is worth noting that although in the diagram it appears that there are four independent copies of the fast decoder 1004, in reality in the present exemplary embodiment this is achieved by using only one fast decoder which is used during non overlapping time intervals. The FastUE flag of the fast decoder as applied to both 72B packets is ORed logically 1005 to determine if either packet as a FastUE. It may be that neither packet has a FastUE in spite of the fact that during a normal access one of the packets did have a FastUE because the error causing the FastUE might have been transient and disappeared after the retry.

If either of the 72B packets has a FastUE as determined by the fast decoder 1003, then the decoder requests that the memory controller retry all pending requests BUT the current one. This is done to make space in time for a Chien search 1007 to be performed. This Chien search is implemented as a serial process during which each chip location is tested to see whether a chipkill may be taking place in that location. It is an important feature of this invention that this process is implemented serially as that way we attain significant hardware savings. This slow process nonetheless cannot be made concurrently with other decoding activity, and that is the reason the decoder requests a retry of all pending requests but the current one. The Chien search 1007 is enabled with a signal 1006 from the OR computation 1005. The input of the Chien search 1007 are the two syndromes of the 72B packets passed in retry mode, along with the marking information which is the same for both packets. The output of the Chien search is a (potentially) new set of marking information 1008, which might describe new marks pointing to where the ×8 or ×4 chipkill has occurred. It may be appreciated that the Chien search 1007 is the only place where the ×4/×8 select control signal 1009 is employed in the entire decoder, including the fast decoder and the decoder in retry mode. The Chien search 1007 since it is implemented as a serial process, admits a very efficient implementation when compared to the implementation of the fast decoder.

In some instances it is not legal to search for new chipkills. For example, in x4 mode at most two chipkills are supported and therefore it does not make sense to attempt to locate a third chipkill. To this end, there is a stage 1009 to which the old and new marking info are fed, which decides whether the new marks are valid or not. If so, it feeds them back to the fast decoder (for both 72B packets) so that the fast decoder can attempt to decode the data again. If it is not legal for the Chien search to generate new marking information, then the old marking information is passed instead to both applications of the fast decoder.

If valid new marking information has been generated by the Chien search, then it is expected that the fast decoder will be able to correct a ×4 or ×8 chipkill.

Figure 13:
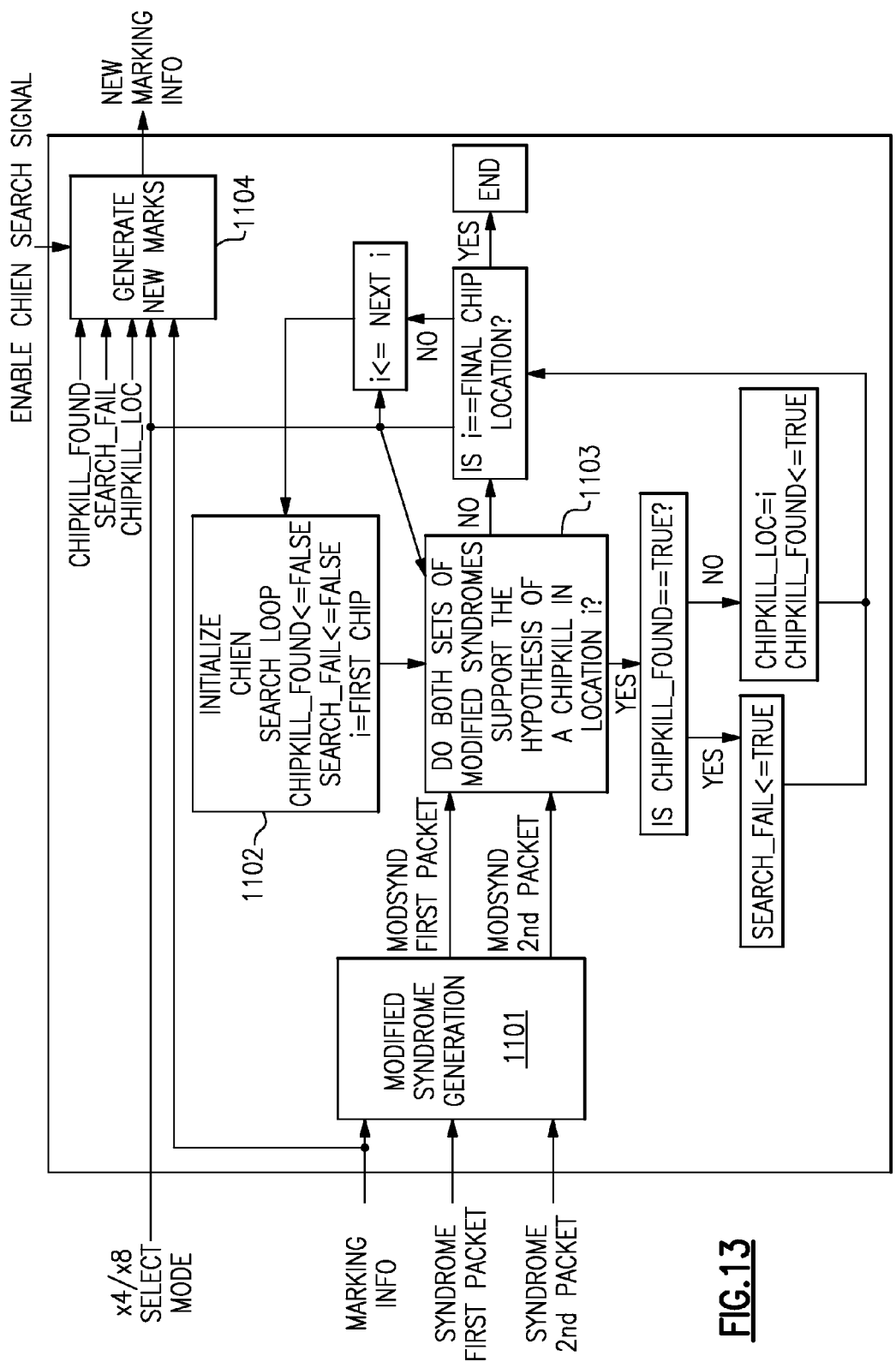
FIG. 13. illustrates the internal composition of the Chien search, which is able to analyze the syndromes of two error control codewords simultaneously in accordance with the invention.

In FIG. 13, we find a high level description of how the Chien search is implemented. The marking info and the syndrome of both packets are fed to a modified syndrome generation engine 1101 which produces two sets of modified syndromes, one for each packet. These modified syndromes no longer have any contributions from errors pointed to by the marking information.

The Chien search is initialized in 1102 where flags chipkill_found and search_fail are set to false and a pointer i is set to the location of the first chip.

In a test 1103, both sets of modified syndromes are checked to see whether a chipkill might exist in that chip location. The way this is attained is by further modifying the modified syndromes to remove any error contributions coming from the chip currently being pointed to by the pointer i, and to check whether the resulting (twice) modified syndromes are all equal to zero. If this is the case for both of the (twice) modified syndromes then the test 1103 results in "Yes"

Then the flag chipkill_found is tested to see whether it is equal to "True". If not, then the chipkill_loc pointer is made to point to the current pointer i, and the chipkill_found flag is set to "True". If on the other hand the chipkill_found flag is already set to "True" then the search_fail flag is raised. The rationale behind this process is that only exactly one location may claim a chipkill, and if more than one location claims a chipkill, there is ambiguity and the Chien search loop fails.

The procedure described above is repeated until all chips have been examined. Then a module that generates new marks 1104 takes the chipkill_found, search_fail flags, the chipkill_loc pointer, the old marking information, the ×4/×8 select signal and the Enable Chien Search Signal to produce new marking information.

A general design philosophy employed in this invention is that an optimized circuit (the fast decoder) is designed to be able to deal with most error events (which do not affect more than one new symbol error), and that a very small circuit that takes much longer to operate is employed in very rare circumstances. This results in lower latency and smaller circuit area than if the decoder had to additionally correct for rare but catstrophic events such as chipkills. When a new chipkill is discovered, a slow procedure to figure out its location is invoked (aided by the memory controller request retry functionality), but this does not result in any measurable performance degradation in the system because once the slow procedure has finished, the location of the chipkill becomes known and stored in the marking store. Thus subsequent accesses to this memory rank no longer result in a retry.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that other modifications and embodiments are intended to be included within the scope of the appended claims.

That which is claimed is:

1. A system for error control coding for memories of different types, wherein the type of a memory is determined by the type of the chips used in the memory, the system comprising:

error control encoder circuitry to encode data for storage in memories of different types; and error control decoder circuitry to decode encoded data received from memories of different types; wherein the error control circuitry has a fast decoding mode and a slow decoding mode.

2. The system of claim 1 wherein the type of the memory is passed to said error control decoder circuitry.

3. The system of claim 1 wherein the same error control encoder circuitry is used independently of the type of the memory.

4. The system of claim 1 wherein the type of the chips is determined by an input pin count and an output pin count for each of said chips.

5. The system of claim 4 wherein said chips have an input pin count and an output pin count of 4, 8, or 16.

6. The system of claim 1 wherein said error control decoder circuitry's error handling capabilities vary as the type of the memory varies.

7. The system of claim 1 wherein the slow decoding mode is affected by the type of memory from which data is being received.

8. The system of claim 1 wherein said error control decoder circuitry supports different numbers of memory chip failures for memories of different types.

9. A method for error control coding for memories of different types, wherein the type of a memory is determined by the type of the chips used in the memory, the method comprising:

using error control encoder circuitry to encode data for storage in memories of different types; and using error control decoder circuitry to decode encoded data received from memories of different types; wherein the error control circuitry has a fast decoding mode and a slow decoding mode.

10. The method of claim 9 wherein the type of the memory is passed to the error control decoder circuitry.

11. The method of claim 9 wherein the same error control encoder circuitry is used independently of the type of the memory.

12. The method of claim 9 wherein the type of the memory chips is determined by an input pin count and an output pin count for each of the memory chips.

13. The method of claim 9 wherein the error control decoder circuitry's error handling capabilities vary as the type of the memory varies.

14. The method of claim 9 wherein the error control encoder circuitry uses a parity check matrix based upon a Reed-Solomon code.

15. The method of claim 9 wherein the error control decoder circuitry supports different numbers of memory chip failures for memories of different types.

16. A computer program product embodied in a non-transient tangible media comprising:

computer readable program codes coupled to the tangible media for error control coding for memories of different types, wherein the type of a memory is determined by the type of the chips used in the memory, the computer readable program codes configured to cause the program to:

use error control encoder algorithms to encode data for storage in memories of different types; and use error control decoder algorithms to decode encoded data received from memories of different types;

wherein the error control circuitry has a fast decoding mode and a slow decoding mode.

17. The computer program product of claim 16 wherein the type of the memory is passed to the error control decoder algorithms.

18. The computer program product of claim 16 further comprising program code configured to: use the same error control encoder algorithms independently of the type of the memory.

19. The computer program product of claim 16 further comprising program code configured to: allow for the error control decoder algorithm's error handling capabilities to vary as the memory type varies.

20. The computer program product of claim 16 further comprising program code configured to: support different numbers of memory chip failures for memories of different types in the error control decoder algorithms.

21. The system of claim 1 wherein the number of pins of the chips determines the type of the chips.

\* \* \* \* \*